United States Patent [19]
Shankar et al.

[11] Patent Number: 5,526,391
[45] Date of Patent: Jun. 11, 1996

[54] N+1 FREQUENCY DIVIDER COUNTER AND METHOD THEREFOR

[75] Inventors: Ravi Shankar; Ana S. Leon, both of Austin, Tex.

[73] Assignee: Motorola Inc., Schaumburg, Ill.

[21] Appl. No.: 431,000

[22] Filed: Apr. 28, 1995

[51] Int. Cl.$^6$ ...................... H03K 21/08
[52] U.S. Cl. .............. 377/47; 377/56; 377/118
[58] Field of Search .................. 377/47, 48, 49, 377/52, 56, 118

[56] References Cited

U.S. PATENT DOCUMENTS

| 4,443,887 | 4/1984 | Shiramizu | 377/48 |
| 4,891,825 | 1/1990 | Hansen | 377/52 |
| 4,935,944 | 6/1990 | Everett | 377/48 |
| 5,127,036 | 6/1992 | Pham | 377/47 |
| 5,365,119 | 11/1994 | Kivari | 377/47 |
| 5,390,223 | 2/1995 | Lindholm | 377/49 |
| 5,425,074 | 6/1995 | Wong | 377/47 |

Primary Examiner—John S. Heyman
Attorney, Agent, or Firm—Daniel D. Hill

[57] ABSTRACT

An N+1 frequency divider counter (20) has a binary counter (22), ones detect circuitry (26), control logic (24), and an output flip-flop (28). The binary counter (22) counts from an initial value to a final value for each half of an output clock signal. If N+1 is an even number, one full cycle is added to each half cycle of the output clock signal. If N+1 is an odd number, one-half of a cycle is added to each half phase of the output clock signal. At the final count value, the control logic (24) causes the output clock signal to transition on either the rising edge or the falling edge of an input clock signal. The N+1 counter (20) has a fifty percent duty cycle for all count values of N, and does not require additional circuitry to accommodate when N equals zero.

17 Claims, 4 Drawing Sheets

N+1 FREQUENCY DIVIDER COUNTER AND METHOD THEREFOR

FIELD OF THE INVENTION

This invention relates generally to counters, and more particularly, to an N+1 frequency divider counter and a method therefor.

BACKGROUND OF THE INVENTION

A frequency divider counter generally provides an output clock signal having a frequency that is lower than a frequency of an input clock signal. Frequency divider counters are commonly used to step down a system clock frequency for certain circuits in a system that require a lower operating frequency than the system clock frequency.

The frequency divider counter receives a sequence of binary numbers starting at a predetermined value and counts up or down by one until a predetermined final value is reached. In some N+1 frequency divider counters, if the counter is counting an odd number of cycles of the input clock signal, the stepped down output clock signal will not have a 50 percent duty cycle. For example, if N+1 is equal to 11, one phase of the output clock signal will include 6 clock cycles of the input clock signal, and the other phase of the output clock signal will include 5 clock cycles of the input clock signal. This results in a duty cycle that is different than the desired fifty percent duty cycle for the output clock signal. In some applications, a fifty percent duty cycle is required for proper operation of the circuit receiving the stepped down clock signal. In those N+1 frequency divider counters that do have a fifty percent duty cycle for odd values of N+1, added complexity is required for the case when N is equal to zero.

DESCRIPTION OF THE PREFERRED EMBODIMENT

Generally, the present invention provides an N+1 frequency divider counter having a binary counter, a ones detect circuit, a control logic circuit, and an output flip-flop. The binary counter begins counting up from an initial value determined by the most significant bits (MSBs) of a binary count value N. The control logic receives the least significant bit (LSB) of the count value N. Removing the LSB from the binary count value has substantially the same effect as an arithmetic right shift, dividing the count value N by two. If the logic state of the LSB is a one, indicating that N+1 is an even number, the binary counter counts the number of clock cycles determined by the MSBs and one full clock cycle is added to each half of the N+1 counter output clock signal. If the logic state of the LSB is a zero, indicating that N+1 is an odd number, the binary counter counts the number of cycles determined by the MSBs and one half cycle is added to each half of the N+1 counter output clock signal. At the end of a logic high phase of the output clock signal, the control logic circuit causes the output signal to transition on the rising edge of the input clock signal when the LSB is a logic one, or on the falling edge of the input clock signal when the LSB is a logic zero.

The N+1 frequency divider counter has an advantage of providing a fifty percent duty cycle for all count values of N, whether N is a positive number or zero. Also, the N+1 counter does not need additional circuitry, such as a comparator or a zero detect circuit to accommodate the case when N equals zero. Because the N+1 counter has reduced complexity, the N+1 counter is able to combine lower power consumption with high speed operation.

Figure 1:
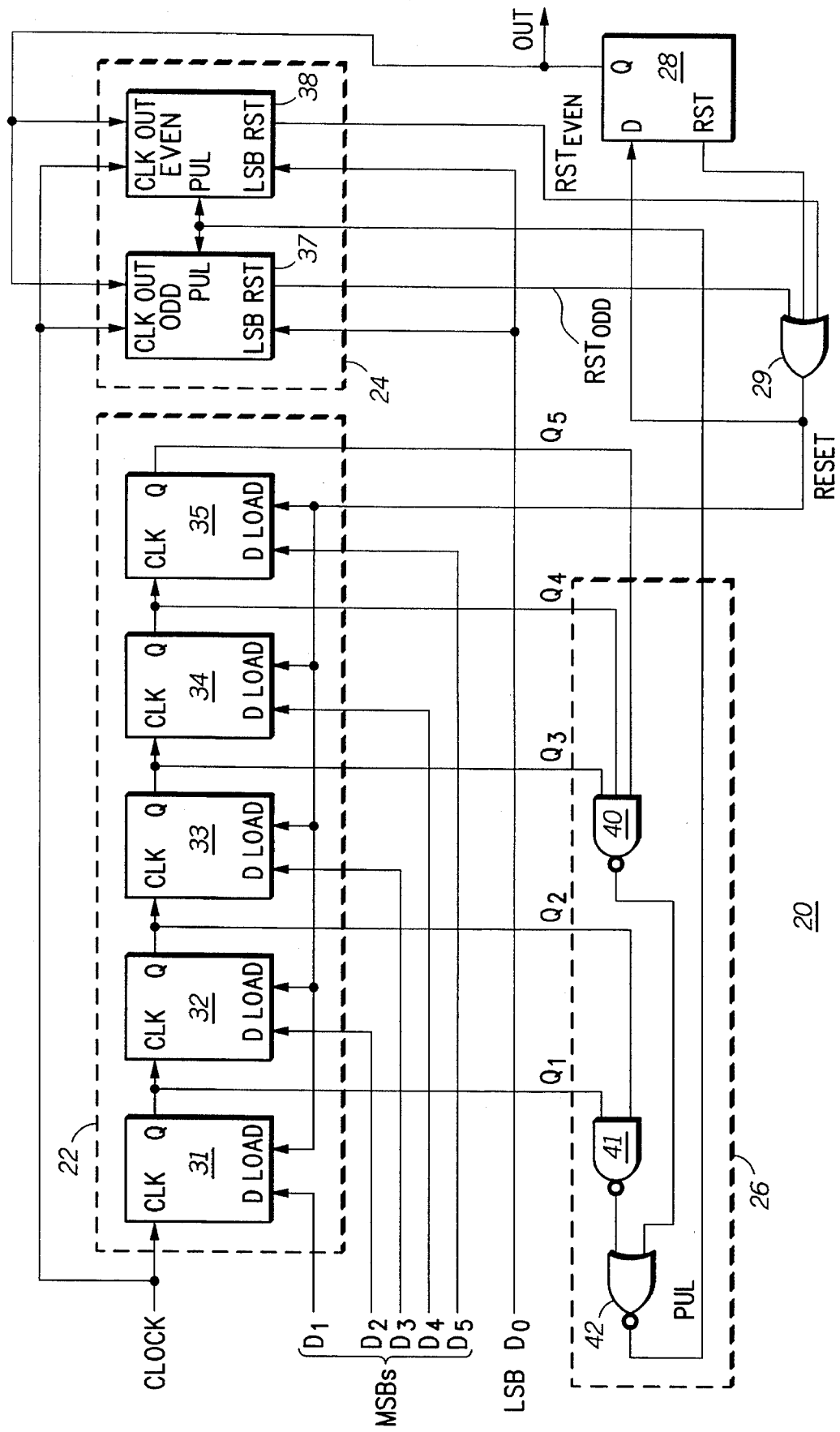
FIG. 1 illustrates, in partial block diagram form and partial logic diagram form, an N+1 frequency divider counter in accordance with the present invention.

The present invention can be more fully described with reference to FIGS. 1–4. FIG. 1 illustrates, in partial block diagram form and partial logic diagram form, an N+1 frequency divider counter 20 in accordance with the present invention. N+1 counter 20 includes a binary counter 22, a control logic circuit 24, a ones detect circuit 26, an output flip-flop 28, and an OR logic gate 29. Binary counter 22 includes flip-flops 31–35. Control logic 24 includes a first logic circuit 37 and a second logic circuit 38. Ones detect circuit 26 includes NAND logic gates 40 and 41, and NOR logic gate 42.

In binary counter 22, each of flip-flops 31–35 has a first input terminal labeled "D", a second input terminal labeled "CLK", a third input terminal labeled "LOAD", and an output terminal labeled "Q". Flip-flop 31 receives a periodic clock signal labeled "CLOCK" having a predetermined frequency at the CLK input terminal, a first data signal labeled "$D_1$" at the D input terminal, a reset signal labeled "RESET" at the LOAD input terminal, and provides an output signal labeled "$Q_1$" and the Q output terminal. Flip-flop 32 has the CLK input terminal connected to the Q output terminal of Flip-flop 31, the D input terminal receives a second data signal labeled "$D_2$", the load input terminal receives the reset signal RESET, and the Q output terminal provides an output signal labeled "$Q_2$". Flip-flop 33 has the CLK input terminal connected to the Q output terminal of Flip-flop 32, the D input terminal receives a second data signal labeled "$D_3$", the load input terminal receives the reset signal RESET, and the Q output terminal provides an output signal labeled "$Q_3$". Flip-flop 34 has the CLK input terminal connected to the Q output terminal of Flip-flop 33, the D input terminal receives a second data signal labeled "$D_4$", the load input terminal receives the reset signal RESET, and the Q output terminal provides an output signal labeled "$Q_4$". Flip-flop 35 has the CLK input terminal connected to the Q output terminal of Flip-flop 34, the D input terminal receives a second data signal labeled "$D_5$", the load input terminal receives the reset signal RESET, and the Q output terminal provides an output signal labeled "$Q_5$".

In control logic circuit 24, first logic circuit 37, labeled "ODD", has a CLK input terminal for receiving the clock signal CLOCK, an input terminal labeled "LSB" for receiving an LSB data signal labeled "$D_0$", an output terminal labeled "RST" for providing reset signal labeled "$RST_{ODD}$", an input terminal labeled "PUL" for receiving a pulse labeled "PUL", and an input terminal labeled "OUT" for receiving output clock signal OUT. The second logic circuit, labeled "EVEN", has a CLK input terminal for receiving the clock signal CLOCK, an input terminal labeled "LSB" for receiving LSB data signal $D_0$, an output terminal labeled "RST" for providing a reset signal labeled "$RST_{EVEN}$", an input terminal labeled "PUL" for receiving pulse PUL, and an input terminal labeled "OUT", for receiving output clock signal OUT.

Figure 2:
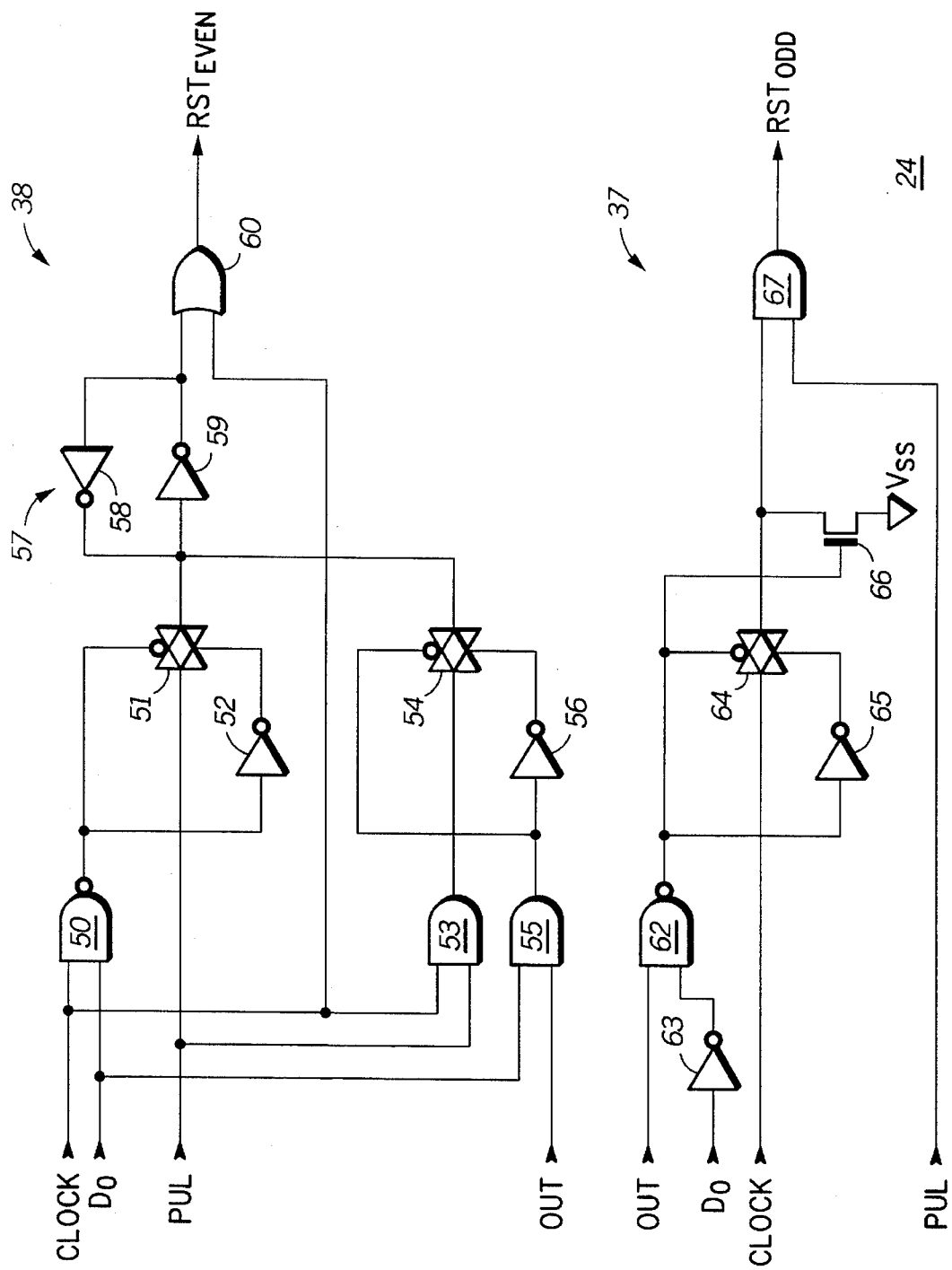
FIG. 2 illustrates, in logic diagram form, the control logic of the N+1 frequency divider counter of FIG. 1.

Ones detect circuit 26 is a essentially a decoder circuit for detecting when output signals $Q_1$–$Q_5$ are all equal to logic ones. In ones detect circuit 26, NAND logic gate 41 has a first input terminal connected to the Q output terminal of flip-flop 31 for receiving output signal $Q_1$, a second input terminal connected to the Q output terminal of flip-flop 32 for receiving output signal $Q_2$, and an output terminal. NAND logic gate 40 has a first input terminal connected to the Q output terminal of flip-flop 33 for receiving output signal $Q_3$, a second input terminal connected to the Q output terminal of flip-flop 34 for receiving output signal $Q_4$, a third output terminal connected to the Q output terminal of flip-flop 35 for receiving output signal $Q_5$, and an output terminal. NOR logic gate 42 has a first input terminal connected to the output terminal of NAND logic gate 41, a second input terminal connected to the output terminal of NAND logic gate 40, and an output terminal connected to the PUL input terminals of first control logic 37 and second logic circuit 38 for generating a control signal, or pulse, labeled "PUL". Note that the logic gates illustrated in the FIGS. 1 and 2 are intended to illustrate logical operations and not specific logic gates.

OR logic gate 29 has a first input terminal connected to the RST output terminal of first control logic 37, a second input terminal, a third input terminal connected to the RST output terminal of second logic circuit 38, and an output terminal connected to the LOAD input terminals of flip-flops 31–35. Flip-flop 28 has a D input terminal connected to the output terminal of OR logic gate 29, an RST output terminal coupled to the second input terminal of OR logic gate 29, and a Q output terminal connected to the OUT input terminals of first control logic 37 and second control logic 38 for providing a clock output signal labeled "OUT".

The count value N can be a positive number or zero, and determines the number of cycles counted by N+1 counter 20. Count value N is provided to N+1 counter 20 as a six bit binary number in the form of data signals $D_0$–$D_5$. In the illustrated embodiment, data signals $D_1$–$D_5$ represent the five most significant bits (MSBs) of the six bit binary number. Data signal $D_0$ is the least significant bit (LSB) of the six bit binary number. N+1 counter 20 counts from a predetermined initial value determined by the five MSB data signals $D_1$–$D_5$ to a final value. LSB data signal $D_0$ is not counted, but is used to determine whether to add one-half of a clock cycle to each half phase of output clock signal OUT (N+1 is an odd integer), or to add one full clock cycle to each phase of output clock signal OUT (N+1 is an even integer). Because binary counter 22 is a count up counter in the illustrated embodiment, the initial count value provided as MSB data signals $D_1$–$D_5$ is the inverse of count value N. Several examples are provided below to better illustrate the operation of N+1 counter 20 for odd and even count values.

Figure 3:
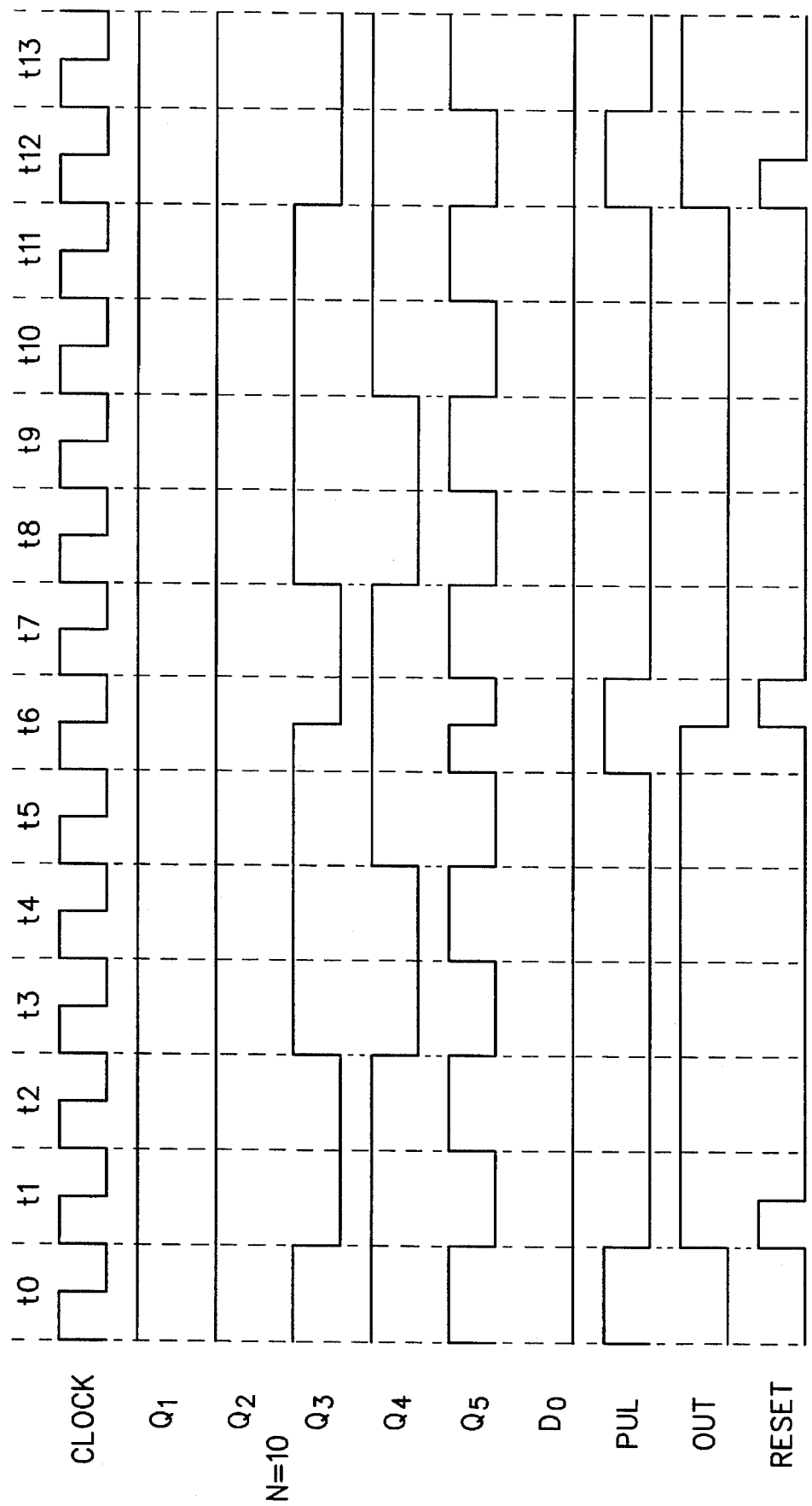
FIG. 3 is a timing diagram for illustrating the operation of the N+1 counter of FIG. 1 when N is equal to 10.

As an example, if N is equal to 10, output clock signal OUT is 1/11th the frequency of clock signal CLOCK. If N is equal to six bit binary number 001010 (decimal number 10), the five MSBs are 00101 (decimal number 5), and the inverse of 00101 is the initial value of 11010. MSB data signals $D_1$–$D_5$ receive the initial value of 11010 (decimal number 26) and LSB data signal $D_0$ receives the LSB of the original six bit binary number 001010, or a logic zero. Binary counter 22 then counts from binary number 11010 to 11111 for the logic high phase of output clock signal OUT. When 11111 is reached, one-half of a clock cycle of clock signal CLOCK is added to the end of the logic high phase of output clock signal OUT, pulse PUL is a logic high and is provided to control logic 24. Control logic 24 provides reset signal $RST_{ODD}$ to OR logic gate 29, which provides a logic high reset signal RESET to the load terminals of flip-flops 31–35. Reset signal RESET causes the initial value 11010 to be reloaded into binary counter 22, and on the next clock cycle of clock signal CLOCK, binary counter 22 begins to count from binary number 11010. Also reset signal RESET is provided to the D terminal of output flip-flop 28 to cause output clock signal OUT to transition to a logic low on the falling edge of clock signal CLOCK (since data signal $D_0$ is zero), and one-half of a clock cycle is added to the beginning of the logic low phase of output clock signal OUT. Output clock signal OUT is monitored by control logic circuit 24 to determine when to add the one-half clock cycle to output clock signal OUT. The one-half clock cycles are added on both sides of the logic high to logic low transitions of output clock signal OUT. FIG. 3 illustrates a timing diagram for when N is equal to 10 and will be discussed later.

Figure 4:
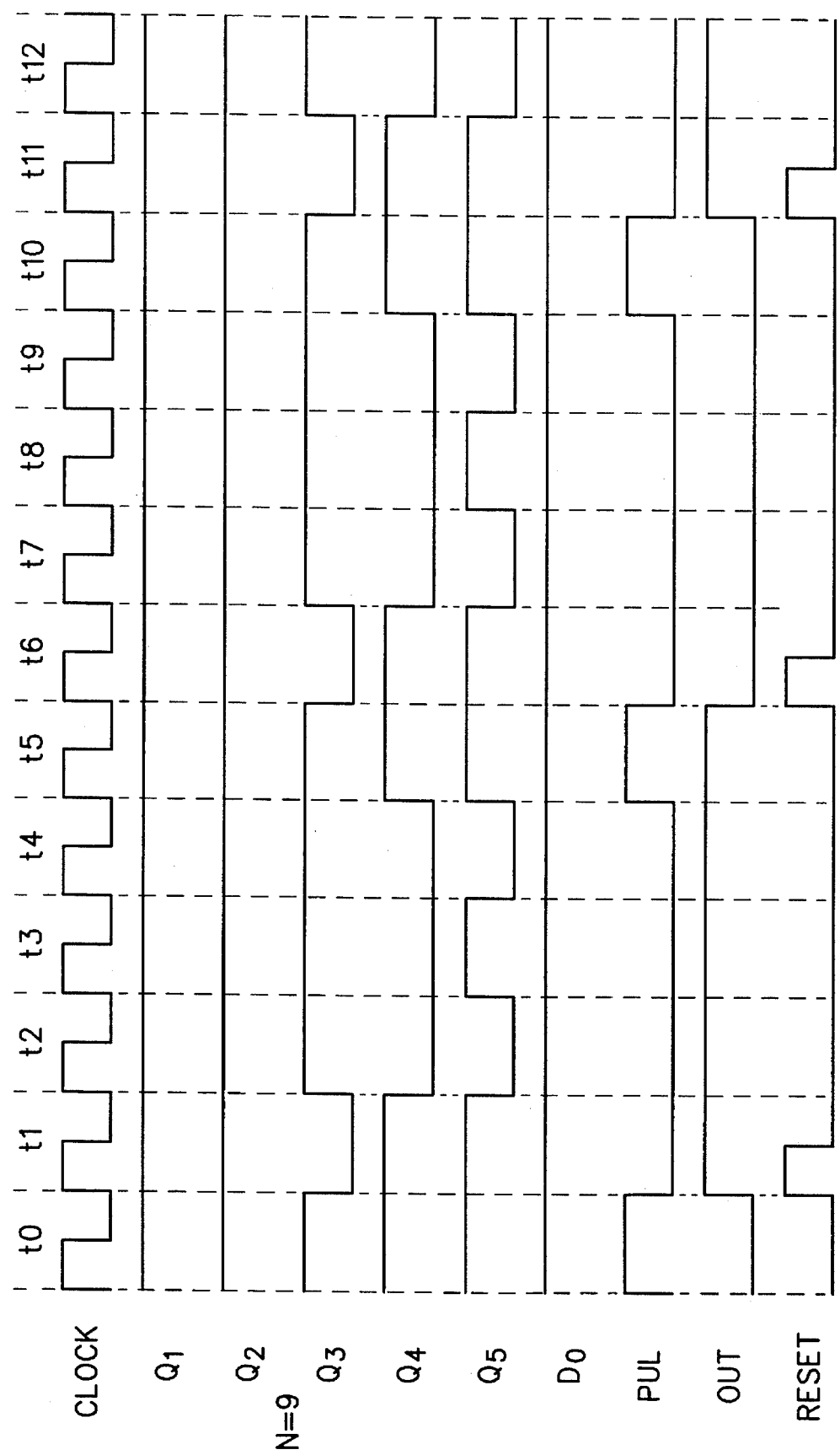
FIG. 4 is a timing diagram for illustrating the operation of the N+1 counter of FIG. 1 when N is equal to 9.

As another example, when N is equal to 9, N+1 is an even number and output clock signal OUT is provided at about 1/10 the frequency of clock signal CLOCK. N is equal to 001001 (decimal number 9). The five MSBs are 00100 (decimal number 4) and the LSB is a logic one. Therefore, binary counter 22 counts four clock cycles of clock signal CLOCK. MSB data signals $D_1$–$D_5$ receive the initial count value of binary number 11011 (decimal number 27), which is the inverse of 00100. Output clock signal OUT, begins as a logic high, binary counter 22 counts 4 clock cycles of clock signal CLOCK. After four clock cycles, control logic 24 adds one full clock cycle to the end of the logic high phase of output clock signal OUT. Output clock signal OUT transitions to a logic low, the initial value (11011 is reloaded, and control logic 24 adds one full clock cycle to the beginning of the logic low phase of output clock signal OUT. Binary counter 22 then counts four clock cycles for the rest of the logic low phase of output clock signal OUT, causing each half-phase to equal 5 clock cycles. FIG. 4 illustrates a timing diagram for when N is equal to 9 and will be discussed later.

N+1 counter 20 does not need additional circuitry, such as a comparator or zero detect circuitry to accommodate the case when N equals zero. If N is equal to zero (000000), N+1 is equal to 1, the five MSBs are 00000, and the LSB is 0. The five MSBs are inverted to equal an initial value of 11111, and are provided as data signals $D_1$–$D_5$. The logic zero LSB indicates that one-half of a clock cycle of clock signal CLOCK is added to each phase of output clock signal OUT. Since data signals $D_1$–$D_5$ have an initial value of 11111, ones detect circuit 26 provides pulse PUL on each one-half cycle of clock signal CLOCK, and the initial value 11111 is reloaded on each half cycle, thus providing output clock signal OUT having the same frequency as input clock signal CLOCK.

Note that in the illustrated embodiment, binary counter 22 is a five bit counter having five flip-flops. However, the number of flip-flops in binary counter 22 is not important for describing the invention, and may be different in other embodiments. Also, in the illustrated embodiment, binary counter 22 counts up. In other embodiments, binary counter 22 may count down, which would eliminate the need to invert the binary number for N and would require ones detect circuit 26 to be replaced with a zeros detect circuit.

N+1 counter 20 has an advantage of providing a fifty percent duty cycle for all count values of N. Also, N+1 counter 20 combines lower power consumption with high speed operation. In addition, the N+1 counter does not need additional circuitry, such as a comparator or zero detect circuitry to accommodate the case when N equals zero. Both phases of output clock signal OUT are of equal duration for any value of N, thus providing a 50 percent duty cycle.

FIG. 2 illustrates, in logic diagram form, control logic 24 of the N+1 frequency divider counter of FIG. 1. Control logic circuit 24 includes first logic circuit 37 and second logic circuit 38. First logic circuit 37 includes inverters 63 and 65, NAND logic gate 62, AND logic gate 67, transmission gate 64, and N-channel transistor 66. Second logic circuit 38 includes NAND logic gate 50, AND logic gates 53 and 55, inverters 52, 56, 58, and 59, transmission gates 51 and 54, and OR logic gate 60.

In first logic circuit 37, inverter 63 has an input terminal for receiving LSB data signal $D_0$, and an output terminal. NAND logic gate 62 has a first input terminal for receiving clock signal clock, a second input terminal coupled to the output terminal of inverter 63, and an output terminal. Transmission gate 64 has an input terminal for receiving clock signal CLOCK, a output terminal, a first control terminal connected to the output terminal of NAND logic gate 62, and a second control terminal. Inverter 65 has an input terminal connected to the output terminal of NAND logic gate 62, and an output terminal connected to the second control terminal of transmission gate 64. AND logic gate 67 has a first input terminal connected to the output terminal of transmission gate 64, a second input terminal for receiving pulse PUL, and an output terminal for providing reset signal $RST_{ODD}$.

In second logic circuit 38, NAND logic gate 50 has a first input terminal for receiving clock signal CLOCK, a second input terminal for receiving LSB data signal $D_0$, and an output terminal. Transmission gate 51 has an input terminal for receiving pulse PUL, an output terminal, a first control terminal connected to the output terminal of NAND logic gate 50, and a second control terminal. Inverter 52 has an input terminal connected to the output terminal of NAND logic gate 50, and an output terminal connected to the second control terminal of transmission gate 51. Inverters 58 and 59 form a latch 57. Inverter 59 has an input terminal connected to the output terminal of transmission gate 51, and an output terminal. Inverter 58 has an input terminal connected to the output terminal of inverter 59, and an output terminal connected to the input terminal of inverter 59. OR logic gate 60 has a first input terminal connected to the output terminal of inverter 59, a second input terminal for receiving clock signal CLOCK, and an output terminal for providing reset signal $RST_{EVEN}$. AND logic gate 53 has a first input terminal for receiving clock signal CLOCK, a second input terminal for receiving pulse PUL, and an output terminal. AND logic gate 55 has a first input terminal for receiving LSB data signal $D_0$, a second input terminal for receiving output clock signal OUT, and an output terminal. Inverter 56 has an input terminal connected to the output terminal of AND logic gate 55, and an output terminal. Transmission gate 54 has an input terminal connected to the output terminal of AND logic gate 53, a first control terminal connected to the output terminal of AND logic gate 55, a second control terminal connected to the output terminal of inverter 56, and an output terminal connected to the input terminal of inverter 59.

First logic circuit 37 includes logic circuits for causing output clock signal OUT to transition from a logic one to a logic zero on the falling edge of clock signal CLOCK when pulse PUL is provided as a logic high and LSB data signal $D_0$ is a logic zero. N-channel transistor 66 is used to quickly reduce the voltage on the first input terminal of AND logic gate 67 when the output terminal of NAND logic gate 62 becomes a logic high, causing transmission gate 64 to become substantially non-conductive.

Second logic circuit 38 includes logic circuits for causing output clock signal OUT to transition from a logic one to a logic zero on the rising edge of clock signal CLOCK when pulse PUL is provided as a logic high and LSB data signal $D_0$ is a logic one. Second logic circuit 38 also causes output clock signal OUT to transition from a logic zero to a logic one on the rising edge of clock signal CLOCK when pulse PUL is provided as a logic high and LSB data signal $D_0$ is either a logic one or a logic zero. Inverters 58 and 59 form a relatively weak latch 57 to maintain the logic state of the first input terminal of OR logic gate 60.

FIG. 3 is a timing diagram for illustrating the example of the operation of N+1 counter 20 of FIG. 1 when N is equal to 10. Each clock cycle of clock signal CLOCK is labeled with a "t" followed by a number. Referring to both FIG. 1 and FIG. 3, when N is equal to 10, N+1 counter 20 counts 11 cycles of clock signal CLOCK for a clock cycle of output clock signal OUT. Clock cycle t0 illustrates the end of a previous binary number count sequence. Output signals $Q_1$–$Q_5$ are 11111, respectively for the end of the last count sequence of binary counter 22. Data signal $D_0$ is a logic low, indicating that N+1 counter 20 is counting an odd number, and output clock signal OUT will transition from a logic high to a logic low on the falling edge of clock signal CLOCK at the end of the logic high phase of output clock signal OUT. Control logic 24 monitors the logic state of output signal OUT and does not cause output signal OUT to transition on the falling edge of clock signal CLOCK if output signal OUT is a logic low. From clock cycle t1 through clock cycle t5, binary counter counts sequentially from 11010 to 11111.

At clock cycle t6, in response to binary counter 22 reaching 11111, NOR logic gate 42 provides a pulse PUL to the PUL terminals of first logic circuit 37 and second logic circuit 38. Since output signal OUT is a logic high and data signal $D_0$ is a logic low, first logic circuit 37 provides a logic high signal from the RST terminal to the first input terminal of OR logic gate 29. OR logic gate provides reset signal RESET to the LOAD terminals of flip-flops 31–35 and to the D terminal of output flip-flop 28. The initial count value of 11010 is reloaded in binary counter 22 and flip-flop 28 causes output clock signal OUT to transition to a logic low on the falling edge of clock signal CLOCK. From clock cycles t6 to t11, binary counter 22 again counts from 11010 to 11111.

At dock cycle t12, when binary counter 22 has completed another count cycle for the logic low phase of output clock signal OUT, that is, when output signals $Q_1$–$Q_5$ are all logic ones, NOR logic gate 42 provides pulse PUL to the PUL input terminals of first control logic 37 and second logic circuit 38. Since output clock signal OUT is a logic low, reset signal $RST_{ODD}$ is provided on the rising edge of clock signal CLOCK. OR logic gate 29 provides a logic high reset signal RESET to the load terminals of flip-flops 31–35 and to the D terminal of output flip-flop 28 to cause output clock signal OUT to transition to a logic high.

FIG. 4 is a timing diagram for illustrating the example of the operation of N+1 counter 20 of FIG. 1 when N is equal to 9. Each clock cycle of clock signal CLOCK is labeled with a "t" followed by a number.

Referring to both FIG. 1 and FIG. 4, when N is equal to 9, N+1 counter 20 counts 10 cycles of clock signal CLOCK for a clock cycle of output clock signal OUT. Clock cycle to illustrates the end of a count sequence. Output signals $Q_1$–$Q_5$ are 11111, respectively for the end of the last count sequence of binary counter 22. Data signal $D_0$ is a logic high, indicating that N+1 counter 20 is counting an even number, and output clock signal OUT will transition from a logic high to a logic low on the rising edge of clock signal CLOCK at the end of the logic high phase of output clock signal OUT. From clock cycle t1 through clock cycle t4, binary counter 22 counts sequentially from 11011 to 11111.

At clock cycle t5, in response to binary counter 22 reaching 11111, NOR logic gate 42 provides pulse PUL to the PUL terminals of first logic circuit 37 and second logic circuit 38. Since output clock signal OUT is a logic high and LSB data signal $D_0$ is a logic high, second logic circuit 38 responds by providing a logic high reset signal $RST_{EVEN}$ from the RST terminal to the third input terminal of OR logic gate 29. OR logic gate 29 provides reset signal RESET to the LOAD terminals of flip-flops 31–35 and to the D terminal of output flip-flop 28. The initial count value of 11011 is reloaded in binary counter 22 and output flip-flop 28 causes output clock signal OUT to transition to a logic low on the rising edge of clock signal CLOCK. From clock cycles t6 to t10, binary counter 22 again counts from 11011 to 11111.

At clock cycle t11, reset signal $RST_{EVEN}$ is provided by second logic circuit 38 to the third input terminal of OR logic gate 29. Or logic gate 29 provides a logic high to the LOAD terminals of flip-flops 31–35 to reload the initial value 11011 into binary counter 22. When binary counter 22 has completed the count cycle for the logic low phase of output clock signal OUT, that is, when output signals $Q_1$–$Q_5$ are all logic ones, NOR logic gate 42 provides pulse PUL to the PUL input terminals of first control logic 37 and second logic circuit 38. Since output clock signal OUT is a logic low, reset signal $RST_{EVEN}$ is provided on the rising edge of clock signal CLOCK. OR logic gate 29 provides a logic high reset signal RESET to the load terminals of flip-flops 31–35 and to the D terminal of output flip-flop 28 to cause output clock signal OUT to transition to a logic high to begin another logic high phase of output clock signal OUT.

While the invention has been described in the context of a preferred embodiment, it will be apparent to those skilled in the art that the present invention may be modified in numerous ways and may assume many embodiments other than that specifically set out and described above. For example, counter 20 is an N+1 counter in the illustrated embodiment. In another embodiment, N+1 counter 20 may be an N counter for counting N clock cycles. Accordingly, it is intended by the appended claims to cover all modifications of the invention which fall within the true spirit and scope of the invention.

What is claimed is:

1. An N+1 frequency divider counter, comprising:

a counter having a plurality of flip-flops, for counting from a predetermined initial value corresponding N+1, where N is a positive integer or zero, to a final value in response to a periodic clock signal having a predetermined frequency, the plurality of flip-flops receiving a binary number corresponding to most significant bits of the predetermined initial value;

a first logic circuit, coupled to the counter, for receiving the final value, and in response, providing a first control signal; and a control logic circuit, coupled to the first logic circuit, for receiving the first control signal, a least significant bit of the predetermined initial value, and the periodic clock signal, and in response, causing an output clock signal to transition on a rising edge of the periodic clock signal when the least significant bit is a logic zero, and the control logic circuit causing the output clock signal to transition on a falling edge of the periodic clock signal when the least significant bit is a logic one.

2. The N+1 frequency divider counter of claim 1, wherein the first logic circuit comprises a decoder circuit having a plurality of input terminals coupled to a plurality of output terminals of the plurality of flip-flops, the decoder circuit having an output terminal for providing the first control signal.

3. The N+1 frequency divider counter of claim 1, wherein the first logic circuit comprises a ones detect circuit having a plurality of input terminals coupled to a plurality of output terminals of the plurality of flip-flops, the ones detect circuit for detecting when all bits of the binary number corresponding to the final value equals logic ones.

4. The N+1 frequency divider counter of claim 3, wherein the control logic circuit provides a reset signal to reload the binary number corresponding to the most significant bits of the predetermined initial value in response to the ones detect circuit detecting when all bits of the binary number corresponding to the final value equals logic ones.

5. The N+1 frequency divider counter of claim 1, further comprising an output flip-flop, responsive to the control logic circuit, for providing the output clock signal.

6. The N+1 frequency divider counter of claim 5, wherein the control logic circuit receives the output clock signal for monitoring transitions of the output clock signal.

7. An N+1 frequency divider counter, comprising:

a binary counter having a plurality of flip-flops, for counting from a predetermined initial value corresponding to N+1, where N is a positive integer or zero, to a final value in response to a periodic clock signal having a predetermined frequency, the plurality of flip-flops receiving a binary number corresponding to most significant bits of the predetermined initial value;

a ones detect circuit, coupled to the counter, for receiving the final value, and in response, providing a first control signal;

a control logic circuit, coupled to the ones detect circuit, for receiving the first control signal, a least significant bit of the predetermined initial value, and the periodic clock signal, and in response, causing an output clock signal to transition on a rising edge of the periodic clock signal when the least significant bit is a logic zero, and the control logic circuit causing the output clock signal to transition on a falling edge of the periodic clock signal when the least significant bit is a logic one; and an output flip-flop, coupled to the control logic circuit, for providing the output clock signal having a frequency equal to or less than the predetermined frequency.

8. The N+1 frequency divider counter of claim 7, wherein the ones detect circuit comprises a decoder circuit having a plurality of input terminals coupled to a plurality of output terminals of the plurality of flip-flops, the decoder circuit having an output terminal for providing the first control signal.

9. The N+1 frequency divider counter of claim 7, wherein the ones detect circuit has a plurality of input terminals coupled to a plurality of output terminals of the plurality of flip-flops, the ones detect circuit for detecting when all bits of the binary number corresponding to the final value equals logic ones.

10. The N+1 frequency divider counter of claim 9, wherein the control logic circuit provides a reset signal to reload the binary number corresponding to the most significant bits of the predetermined initial value in response to the ones detect circuit detecting when all bits of the plurality of output terminals of the plurality of flip-flops equals logic ones.

11. The N+1 frequency divider counter of claim 10, wherein the control logic circuit receives the output clock signal for monitoring transitions of the output clock signal.

12. In an N+1 frequency divider counter, a method for providing an output clock signal having a frequency equal to 1/(N+1) of a frequency of an input clock signal, where N is a positive integer or zero, the method comprising the steps of:

loading an initial value corresponding to most significant bits of N+1 into a counter;

counting from the initial value to a final value at a frequency determined by the input clock signal;

generating a control signal in response to the counter reaching the final value;

resetting the counter to the initial value;

transitioning the output clock signal from a first logic state to a second logic state on a rising edge of the input clock signal in response to the control signal if a least significant bit of the initial value is a logic zero; and transitioning the output clock signal from the first logic state to the second logic state on a falling edge of the input clock signal in response to the control signal if the least significant bit is a logic one.

13. The method of claim 12, wherein the step of counting comprises counting up from the initial value to the final value.

14. The method of claim 12, wherein the step of counting comprises counting down from the initial value to the final value.

15. The method of claim 12, wherein the step of generating the control signal comprises generating the control signal in response to the final value being a binary number having all bits are equal to a logic one.

16. The method of claim 12, further comprising a step of monitoring a logic state of the output clock signal to determine if the output clock signal should transition on the falling edge of the input clock signal or on the rising edge of the input clock signal in response to the control signal.

17. The method of claim 12, wherein the step of resetting the counter comprises generating a reset signal in response to the counter reaching the final value.

* * * * *